United States Patent [19]

Ives et al.

[11] Patent Number: 4,734,151

[45] Date of Patent: Mar. 29, 1988

[54] NON-CONTACT POLISHING OF SEMICONDUCTOR MATERIALS

[75] Inventors: Neil A. Ives, Hermosa Beach; Martin S. Leung, Manhattan Beach, both of Calif.

[73] Assignee: The Aerospace Corporation, El Segundo, Calif.

[21] Appl. No.: 12,109

[22] Filed: Feb. 6, 1987

[51] Int. Cl.$^4$ .................. H01L 21/306; B44C 1/22
[52] U.S. Cl. ............................ 156/637; 156/638; 156/642; 156/662; 156/345
[58] Field of Search ..................... 156/636, 637–638, 156/639, 662, 345, 642; 252/79.1, 79.3, 79.4; 134/2, 3, 10, 34; 204/129.1

[56] References Cited

U.S. PATENT DOCUMENTS

| | | | |
|---|---|---|---|
| 2,849,296 | 8/1958 | Certa | 156/639 |
| 3,348,987 | 10/1967 | Stark et al. | 156/345 X |
| 3,629,023 | 12/1971 | Strehlow | 156/345 X |
| 3,677,848 | 7/1972 | Stoller et al. | 156/662 X |
| 4,468,283 | 8/1984 | Ahmed | 156/642 |
| 4,482,425 | 11/1984 | Battey | 156/642 X |

*Primary Examiner*—William A. Powell
*Attorney, Agent, or Firm*—William J. Burke

[57] ABSTRACT

The present invention discloses a non-contact technique of polishing semiconductor materials using an apparatus that produces a laminar flow of a polishing solution across the surface of the material to be polished.

2 Claims, 2 Drawing Figures

U.S. Patent
Mar. 29, 1988
4,734,151
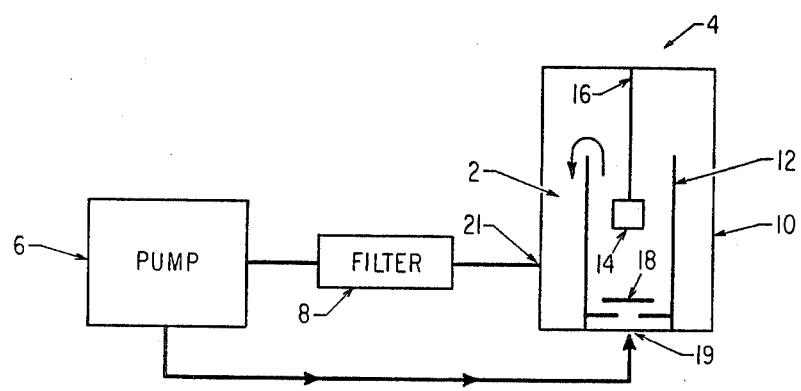
FIGURE 1
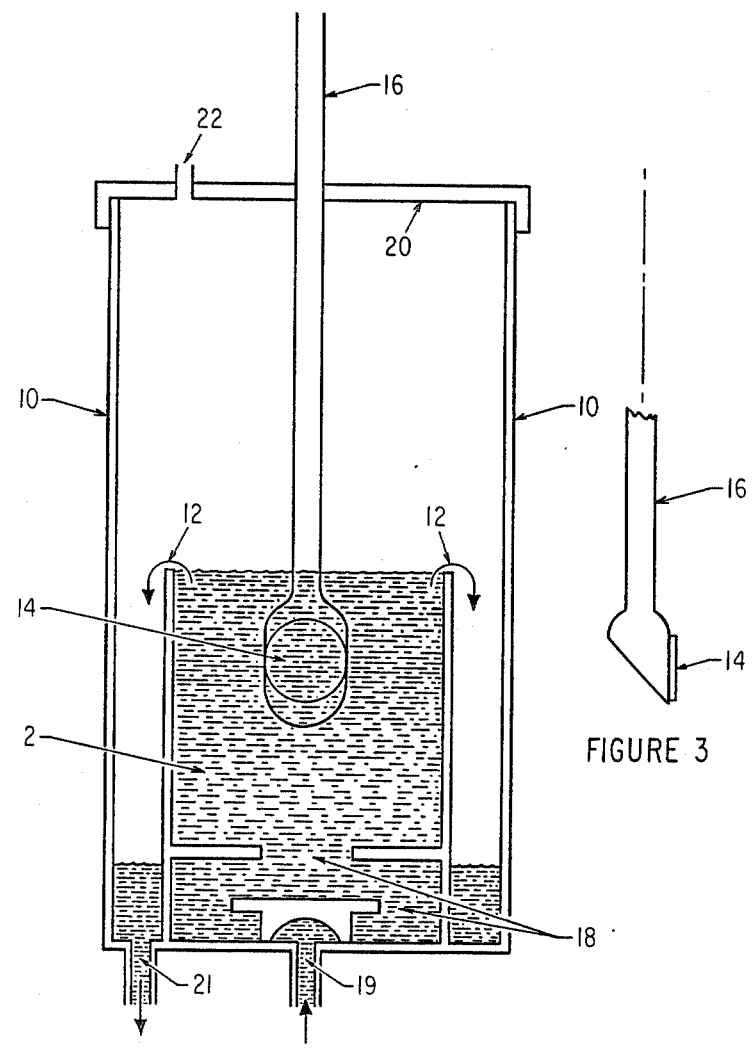
FIGURE 3
FIGURE 2

NON-CONTACT POLISHING OF SEMICONDUCTOR MATERIALS

STATEMENT OF GOVERNMENT INTEREST

The invention described herein may be manufactured and used by or for the Government of the United States for governmental purposes without the payment of royalty therefor.

BACKGROUND OF THE INVENTION

1. Field of the Invention

This invention relates in general to non-contact polishing of semiconductor materials and specifically to the use of polishing solutions.

2. Description of the Prior Art

Polishing of semiconductor wafers is an important step in the fabrication of many semiconductor device structures. For example, flat surfaces are needed for the growth of epitaxial layers. Current methods of cutting and polishing semiconductor wafers can produce a region of extensive damage underneath the surface of mechanically polished wafers. Despite attempts to remove this subsurface damaged region by chemical polishing, residual damage is found in most commercially available polished substrates. The depth of the damaged region varies from a few to several tens of micrometers.

The presence of such a damaged region can seriously affect the performance and reliability of devices fabricated on these substrates. As a result, a need exists to develop polishing methods for removing the damaged region without inflicting further mechanical damage on the substrate surface.

Traditional methods of polishing semiconductors involve one or more of the following contact techniques. The most commonly used technique is abrasive polishing. In this technique, the semiconductor wafer is lapped in a slurry containing a small diameter abrasive ($>5$ $\mu$m), which on contact removes material through mechanical abrasion from the surface that is being polished. Finer and finer abrasives are used until the desired surface finish is achieved. Limitations of this technique are that the ultimate size of the abrasive in the slurries dictates the quality of the final finish and that the uniaxial pressure applied to the sample can create subsurface damage that will remain after the polishing process.

Chemical polishing is commonly used to remove damage left behind by mechanical polishing. In chemical polishing, material removal is achieved by the chemical reaction between the substrate and the polishing solution. It typically requires that the substrate be mounted on a holder and then lapped with a cloth saturated with the polishing solution. Although it produces a highly polished surface, this technique tends to generate a surface damaged region caused by mechanical stress resulting from physical contact between the substrate and the polishing surface. For structurally weak materials such as compound semiconductors, damaged regions extending as far as 40 $\mu$m into the bulk have been reported.

Other methods involve a variation or combination of these techniques. Consequently, compound semiconductor substrates polished by these contact methods tend to retain a highly damaged region beneath the polished surface.

Recently several non-contact methods have been proposed. These methods claim to produce no subsurface damage. One such method called "Magna-Smooth" is an adaptation of the bowl-feed process developed by VTI Inc. of Dayton, Ohio. The bowl-feed method polishes the semiconductor surface by having the sample immersed in a polishing slurry. No fresh abrasives are added during polishing. As the process continues, abrasives are pumped up to the sample and ground finer and finer as they are reused. Gradually, the abrasives are allowed out to settle so that in the final polishing stages, the slurry becomes almost pure water. The polished surface is said to have an RMS roughness and waviness in the 1 to 5 angstrom range. Liabilities of this method are that the process generates enormous pressures on the material, especially in its final, near pure water polishing phase. These pressures are high enough to cause the polished surface to flow. Close examination of the polished surface indicated the formation of a Beilby layer which exhibits morphology different from that of the bulk.

A current state-of-the-art non-contact method is disclosed in U.S. Pat. No. 4,323,422, entitled "Method for Preparing Optically Flat Damage-free Surfaces.+ The method involves a non-contact polishing technique called hydroplane polishing. In this method, the substrate is allowed to hydroplane on a layer of polishing fluid between the substrate and a platen rotating at high velocity.

In this technique, conditions are adjusted such that the substrate surface is allowed to hydroplane on a layer of polishing solution between the substrate and a rotating platen (column 1, lines 48 to 51). Using this method, about 50 microns of material may be removed before the position of the substrate requires readjustment (column 3, lines 50 to 55). The technique is claimed to be capable of producing surfaces which are optically flat within 3000 angstrom over about 80% of the sample.

Successful hydroplaning depends on the viscosity, flow viscosity and surface tension of the polishing solution. The surface tension of the fluid, which increases with its viscosity, exerts a force pulling the substrate toward the polishing pad, counteracting the hydroplaning force. Claimed to be effective in leaving the polished surface undamaged, the technique is difficult to control in practice because a set of highly complex hydrodynamic conditions must be maintained during the polishing process. For example, in high surface tension liquids, this force can be large enough to cause the substrate and polishing pad to come in contact with each other. When this occurs, the substrate can be severely damaged (column 3, lines 10 to 23).

It is therefore a principal object of the invention to provide a non-contact polishing method that is fast, inexpensive, and easy to control.

It is an object of this invention to provide a polishing technique which does not suject the surface to no mechanical stress.

It is also an object of this invention to provide a polishing apparatus that is inexpensive to construct and simple to maintain.

It is a further object of this invention to provide a polishing process that is suitable for automation.

SUMMARY OF THE INVENTION

The laminar flow polishing method is a non-contact polishing technique which utilizes a recirculating laminar flow of polishing solution to chemically polish the semiconductor surface. A polishing solution containing an etchant is allowed to pass over the substrate in a manner that will satisfy the conditions of laminar flow. Under these conditions, material can be remvoed evenly from the substrate surface giving rise to a highly uniform polished surface devoid of the subsurface defects caused by mechanical damage.

BRIEF DESCRIPTION OF THE DRAWINGS

FIG. 1 is a block diagram of the present invention system.

FIG. 2 is a diagram of substrate polishing vessel with substrate holder.

FIG. 3 is a side view of the substrate holder.

DETAILED DESCRIPTION OF THE PREFERRED EMBODIMENT

A block diagram of the present invention is shown in FIG. 1. A polishing solution 2 containing an etchant in solution is recirculated through a polishing vessel 4 using a sealed pump 6 and a filter 8. The vessel 4 consists of two concentric glass tubes, an outer tube 10 and a center tube 12. The substrate 14 to be polished is suspended in vessel 4 by substrate holder 16. A baffle 18 is located at inlet 19 to the bottom of center tube 12 and the polishing solution 2 is pumped into vessl 4 through inlet 19 and out through outlet 21.

The polishing vessel 4 is shown in more detail in FIG. 2. The baffle 18 at the inlet 19 in the bottom of the center tube 12 damps out pulsing action from the pump and allows the polishing solution 2 to flow steadily past the substrate 14. The polishing vessel is enclosed with a glass lid 20 to minimize evaporation of the solution. A small opening 22 in the lid 20 is used to release any pressure that might build up during the polishing process.

As shown in FIG. 3, the substrate holder 16 has a glass stem and a tapered back to minimize the change in flow characteristics over the surface of the substrate 14 to be polished. After passing over the substrate 14, the polishing solution 2 returns to the pump through an in-line filter for recirculation.

This baffling action sets up a uniform flow distribution of the polishing solution 2 over the entire surface of the substrate 14. As the polishing solution 2 passes over the substrate 14, material is removed evenly without subjecting the substrate surface to any mechanical stress. The rate at which the polishing solution 2 is pumped into center tube 12 is set to stay within the laminar flow region.

Polishing rates are controlled by adjusting the concentration of the etchant in the polishing solution. Typical etchants include 2% bromine in methanol. The etchant concentration in the polishing solution is adjusted such that the rate of etchant depletion caused by the etching reaction with the substrate surface is much slower than the rate of etchant replenishment by diffusion and other etchant transport processes. The result is a highly uniform, polished surface devoid of defects caused by mechanical damage.

As shown in the following example, the present invention can be used to produce damage-free polished GaAs material having a high quality surface finish comparable to that produced by the hydroplane polishing method. The substrate was GaAs wafer approximately 400 $\mu$m thick. Subsurface mechanical damage left behind by conventional polishing techniques was about 20 $\mu$m thick. The present invention was then used to remove the damaged region beneath the surface of the wafer. A 2% bromine in methanol solution was used to polish the GaAs wafer at a rate of 5000 Å per minute. These parameters produced a polished and damage free surface on the water. Extensive wafer polishing for thinning has been demonstrated and as much as 75% of the original thickness has been removed while maintaining excellent surface quality over the entire polished wafer.

These results indicate that the present invention is capable of producing a highly polished surface with little or no subsurface mechanical damage. The invention is well suited to polishing semiconductor wafers for microelectronic device fabrication where high quality damage-free substrates are required. In addition, the ease of controlling the polishing conditions makes the present invention a useful technique in production where a high throughput of wafers with a uniform and damage-free surface is essential.

We claim:

1. A method for polishing a flat surface of a semiconductor material comprising the steps of:
    a. placing the surface to be polished into a center tube of a polishing vessel which consists of the center tube and a concentric outer tube;
    b. pumping a polishing solution selected from a mixture of 2% bromine in methanol through a baffled inlet of the center tube, thereby creating laminar flow conditions on the surface to be polished;
    c. recirculating excess polishing solution from an outlet in the outer tube through a filter and into the center tube.

2. An apparatus for polishing the surface of a semiconductor substrate comprising:
    a. a polishing vessel having a center tube, a concentric outer tube and a baffled inlet into the center tube;
    b. a substrate holder for suspending the surface of the substrate to be polished in a cavity formed by the center tube;
    c. a pump means for recycling a polishing solution through the center tube and the outer tube of the polishing vessel whereby the surface of the substrate is polished; and
    d. a filter means for removing substrate and other materials from the polishing solution.

* * * * *